(12) United States Patent
Fujimoto (10) Patent No.: US 6,245,585 B1
(45) Date of Patent: Jun. 12, 2001

(54) METHOD OF PROVIDING LEVELLING AND FOCUSING ADJUSTMENTS ON A SEMICONDUCTOR WAFER

(75) Inventor: Masashi Fujimoto, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/387,200

(22) Filed: Aug. 31, 1999

(30) Foreign Application Priority Data

Sep. 4, 1998 (JP) ................................................. 10-251606

(51) Int. Cl.⁷ ..................................................... H01L 21/66
(52) U.S. Cl. ................................................. 438/14; 438/14
(58) Field of Search ................................. 438/14, 16, 18, 438/463, 907, 108, 109

(56) References Cited

U.S. PATENT DOCUMENTS

| H1774 | * | 1/1999 | Miyachi | 355/67 |
| 5,283,141 | * | 2/1994 | Yoon et al. | 430/30 |
| 5,340,772 | * | 8/1994 | Rosotker | 438/108 |

FOREIGN PATENT DOCUMENTS

| 8-78317 | 3/1996 | (JP) | H01L/21/027 |
| 8-227854 | 9/1996 | (JP) | H01L/21/027 |
| 9-306823 | 11/1997 | (JP) | H01L/21/027 |

* cited by examiner

*Primary Examiner*—David Nelms
*Assistant Examiner*—David Nhu
(74) *Attorney, Agent, or Firm*—Hayes, Soloway, Hennessey, Grossman & Hage, P.C.

(57) ABSTRACT

An adjustment method for photolithography. First, a semiconductor wafer is successively set in one of cell positions. In each of the cell positions, a laser beam is directed to the surface of the wafer and light reflecting off the wafer surface is detected and analyzed to determine a vertical offset position of the wafer at each cell position. Data representing the vertical offset position is stored in a memory and the process is repeated until the offset position data are derived from all cell positions. Thereafter, tilt angles of the wafer at all cell positions are determined from the stored offset position data, and angle data representing the determined tilt angles are stored in a memory. The wafer is then set in one of the cell positions, and the angle data is read from the memory corresponding to the set cell position and the wafer surface is horizontally aligned. The offset position data is read from the memory corresponding to the set cell position and the wafer surface is vertically moved to the focal point, and the process is repeated until the wafer is set to all cell positions.

6 Claims, 6 Drawing Sheets

METHOD OF PROVIDING LEVELLING AND FOCUSING ADJUSTMENTS ON A SEMICONDUCTOR WAFER

BACKGROUND OF THE INVENTION

1. Field of the Invention

The present invention relates generally to photolithography for integrated circuits and more specifically to a method of providing levelling and focusing adjustments on a semiconductor wafer and a photolithography apparatus using the method.

2. Description of the Related Art

In a known photolithography process, a chip pattern is printed in each of a plurality of rectangular cells defined on a semiconductor wafer. Since the wafer is of a circular shape, those cells located at or near the periphery of the wafer may be left unexposed to the light of chip pattern. However, if a positive photoresist is applied to the wafer, the unexposed portion of the photoresist survives after the exposed portion is etched away by a solution. For this reason, the peripheral region of the wafer that is coated with a positive photoresist is also exposed to the chip pattern. However, due to the inherent curvature of the wafer near its circumference, the light modulated by the chip pattern is not precisely focused on the peripheral cells, causing some of the peripheral region of the positive photoresist to be left over as undesired remnant material.

According to another photolithography process, several chip patterns are printed on a single mask (or reticle) and the wafer is exposed to all chip patterns of the mask. According to this technique, only those cells where chip patterns are appropriately printed are shipped as marketable products and others are discarded. However, the problem is that the peripheral cells are not exposed to precisely focused light.

Therefore, a need does exist to precisely control the surface of a wafer at all cell locations for appropriate levelling and focusing purposes.

SUMMARY OF THE INVENTION

It is therefore an object of the present invention to provide an adjustment method for a semiconductor wafer which precisely aligns the surface of the wafer at all cell locations and precisely brings the wafer surface to the focal point of impinging light.

According to one aspect of the present invention, there is provided an adjustment method for a semiconductor wafer. The method comprises the steps of (a) setting the wafer in one of a plurality of cell positions, (b) directing a laser beam to the surface of the wafer and detecting light reflecting off the surface of the wafer, (c) analyzing the detected light and determining therefrom a vertical offset position of the wafer and storing offset position data representing the vertical offset position into a first memory, (d) repeating steps (a) to (c) until a plurality of the offset position data are stored in the first memory, determining a plurality of tilt angles of the wafer at the plurality of cell positions from the stored plurality of offset position data, and storing a plurality of angle data representing the determined tilt angles in a second memory, (e) setting the wafer in one of a plurality of cell positions, (f) reading the angle data from the second memory corresponding to the set cell position and horizontally aligning the wafer surface according to the read angle data, and (g) reading the offset data from the first memory corresponding to the set cell position and vertically moving the wafer surface to the focal point according to the read offset position data. Steps (e) to (g) are repeated until the wafer is set to all cell positions.

According to a second aspect, the present invention provides an adjustment method for a semiconductor wafer, comprising the steps of (a) setting the wafer in one of a plurality of cell positions, (b) directing a laser beam to the surface of the wafer at the one cell position and detecting light reflecting off the surface of the wafer, (c) analyzing the detected light and determining therefrom a vertical offset position of the wafer at the one cell position and storing offset position data representing the vertical offset position into a first memory, (d) repeating steps (a) to (c) until a plurality of the offset position data are stored in the first memory, determining, from the stored plurality of offset position data, a plurality of tilt angles of the wafer at a plurality of cell positions close to the periphery of the wafer, and storing a plurality of angle data representing the determined tilt angles in a second memory, (e) setting the wafer in one of a plurality of cell positions, and (f) determining whether or not the set cell location is close to the periphery of the wafer. At step (g), if the set cell location is not close to the periphery, the angle data is read from the second memory corresponding to the set cell position and the wafer surface is horizontally aligned according to the read angle data, and the offset data is read from the first memory corresponding to the set cell position and the wafer surface is vertically moved to the focal point according to the read offset position data. At step (h), if the set cell location is close to the periphery, a plurality of laser beams is directed to the surface of the set cell position of the wafer and beams reflecting off the surface are detected, the detected beams are then analyzed to determine a plurality of vertical offsets of the set cell position and a tilt angle of the wafer at the set cell position is determined, and the wafer surface is horizontally aligned according to the determined tilt angle and the wafer surface is vertically moved to the focal point according to one of the vertical offsets. Steps (e) to (h) are repeated until the wafer is set to all cell positions.

According a third aspect, the present invention provides a photolithography apparatus comprising a mask support system for supporting a mask having a chip pattern and imagewise-modulating incident light with the chip pattern, a projection lens system for projecting the modulated light onto a focal point, a wafer support system for adjustably and horizontally movably supporting a semiconductor wafer, the system being controlled to successively set the wafer in one of a plurality of cell positions, a position sensing system for directing a laser beam to the surface of the wafer at each of the cell positions and detecting light reflecting off the surface of the wafer, position analyzer circuitry for successively analyzing a signal representing the reflecting light of each the cell positions and determining therefrom a plurality of vertical offset positions of the wafer at the plurality of cell positions, and angle calculation circuitry for determining a plurality of tilt angles of the wafer at the cell positions from the plurality of vertical offset positions. Control circuitry is provided for controlling the wafer support system to successively set the wafer in one of the cell positions, horizontally aligning, at each cell position, the surface of the wafer according to the tilt angle determined for the cell position and vertically moving, at each cell position, the surface of the wafer to the focal point according to the vertical offset position determined for the cell position.

According to a fourth aspect, the present invention provides a photolithography apparatus comprising a mask support system for horizontally movably supporting a mask having a chip pattern and imagewise-modulating incident light with the chip pattern, a shield member having a slit for allowing a portion of the modulated light to pass therethrough, a projection lens system for projecting the light passing through the slit onto a focal point, a wafer support system for adjustably and horizontally movably supporting a semiconductor wafer, the system being controlled to successively set the wafer in one of a plurality of cell positions, a position sensing system for directing a laser beam to the surface of the wafer at each of the cell positions and detecting light reflecting off the surface of the wafer, position analyzer circuitry for analyzing a signal representing the reflecting light of each the cell position and determining therefrom a plurality of vertical offset positions of the wafer at the plurality of cell positions, and angle calculation circuitry for determining a plurality of tilt angles of the wafer at the cell positions from the plurality of vertical offset positions. Control circuitry controls the wafer support system to successively set the wafer in one of the cell positions, horizontally aligns, at each cell position, the surface of the wafer according to the tilt angle determined for the cell position, vertically moves, at each cell position, the surface of the wafer to the focal point according to the vertical offset position determined for the cell position, and controls the wafer support system and the mask support system to simultaneously move the wafer and the mask in opposite horizontal directions each time the wafer is set in each cell position to linearly scan the set cell position of the wafer with the light focused by the lens system.

BRIEF DESCRIPTION OF THE DRAWINGS

The present invention will be described in further detail with reference to the accompanying drawings, in which.

DETAILED DESCRIPTION

Figure 1:
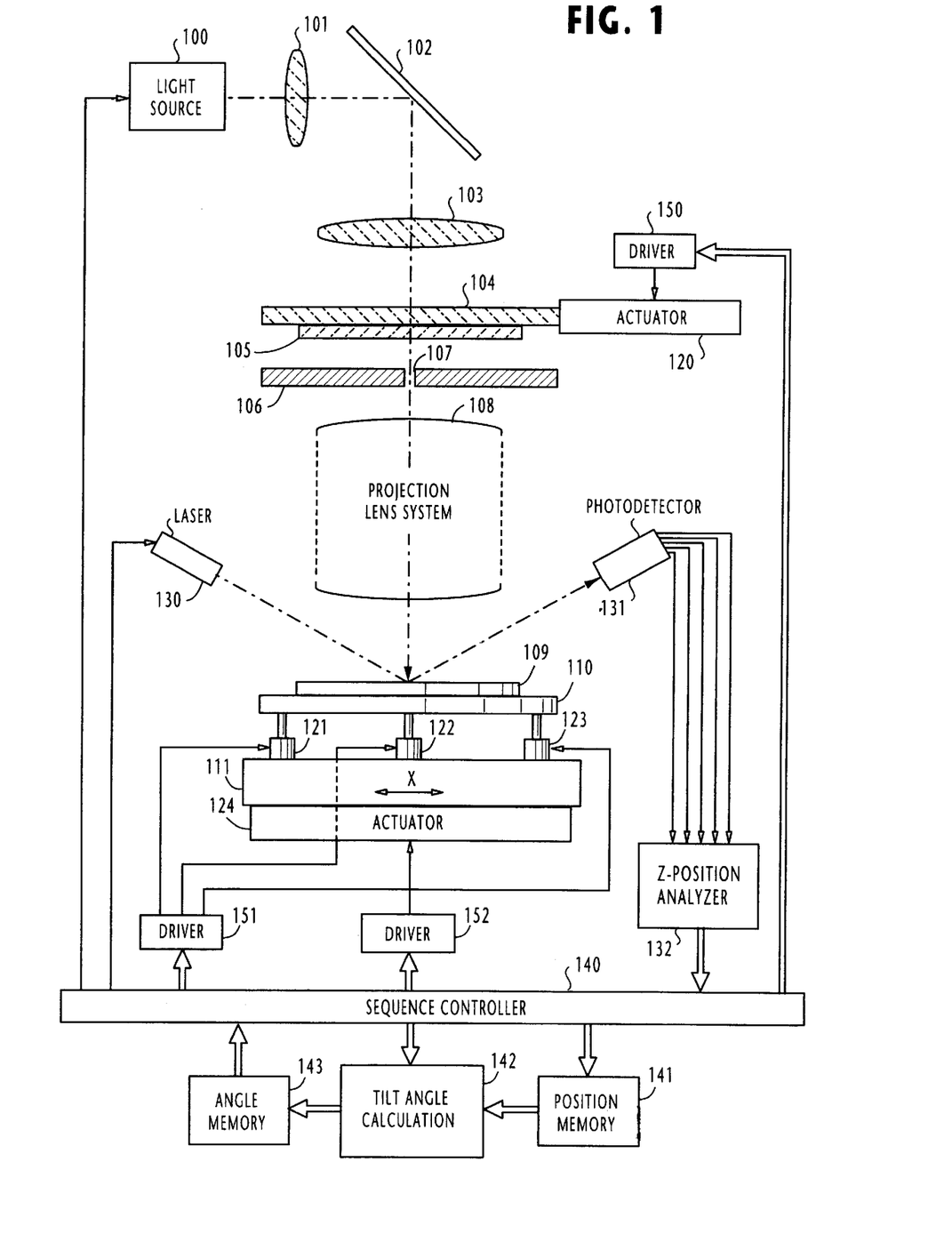
FIG. 1 is a schematic diagram of a photolithography apparatus of the present invention.

Referring now to FIG. 1, there is shown a scanning beam photolithography apparatus according to the present invention. The apparatus includes a light source 100, which produces sufficient optical energy for creating chip patterns on the surface of a semiconductor wafer. Light rays from source 100 are focused through a condenser lens 101 and reflected off the surface of a mirror 102 and directed downwards through a condenser lens 103 to illuminate the surface of a mask (or reticle) 105.

Mask 105, which is printed with a chip pattern, is firmly secured to the lower surface of a transparent mask support member 104. Mask support member 104 is movable in a direction parallel to the X-axis of the X-Y coordinate plane of the apparatus by means of an actuator 120 when a wafer is exposed to light through the chip pattern.

Below the mask 105 is a stationary opaque member 106 having a slit 107 that extends in a direction normal to the direction of movement of the mask 105. In the illustrated embodiment, the slit 107 extends along the Y-axis. The light rays incident on the mask 105 are modulated imagewise by the chip pattern and a portion of the modulated light is allowed to pass through the slit 107 and focused by a projection lens system 108 into a thin line beam. The optical axis of the projection lens system 108 is normal to the X-Y plane, and so it serves as the Z-axis of a three-dimensional space.

A semiconductor wafer 109 is firmly mounted on a wafer support 110, which is secured to a base member 111 by means of a set of actuators 121, 122 and 123 spaced 120 degrees apart from each other. Actuators 121 to 123 are individually operated to move the base member 110 in the direction of the Z-axis to adjust the tilt angle of the wafer 109 in order that the surface of each cell (or chip) of the wafer is aligned to the X-Y plane.

An actuator 124 is provided to vertically move the base member 111 to bring the surface of the wafer 109 to the focal point of the line beam. Another function of the actuator 124 is to horizontally move the base member 111 stepwise by a distance corresponding to one cell in the X and Y directions to set the wafer 109 in a desired cell position on the X-Y plane. With the wafer being set in the position of a desired cell, the actuator 124 is further operated simultaneously with the actuator 120 to move the wafer 109 and the mask 105 in mutually opposite directions along the X-axis, so that the wafer is linearly scanned by the focused line beam and the chip pattern of the mask is printed within the boundary of the desired cell.

Figure 2:
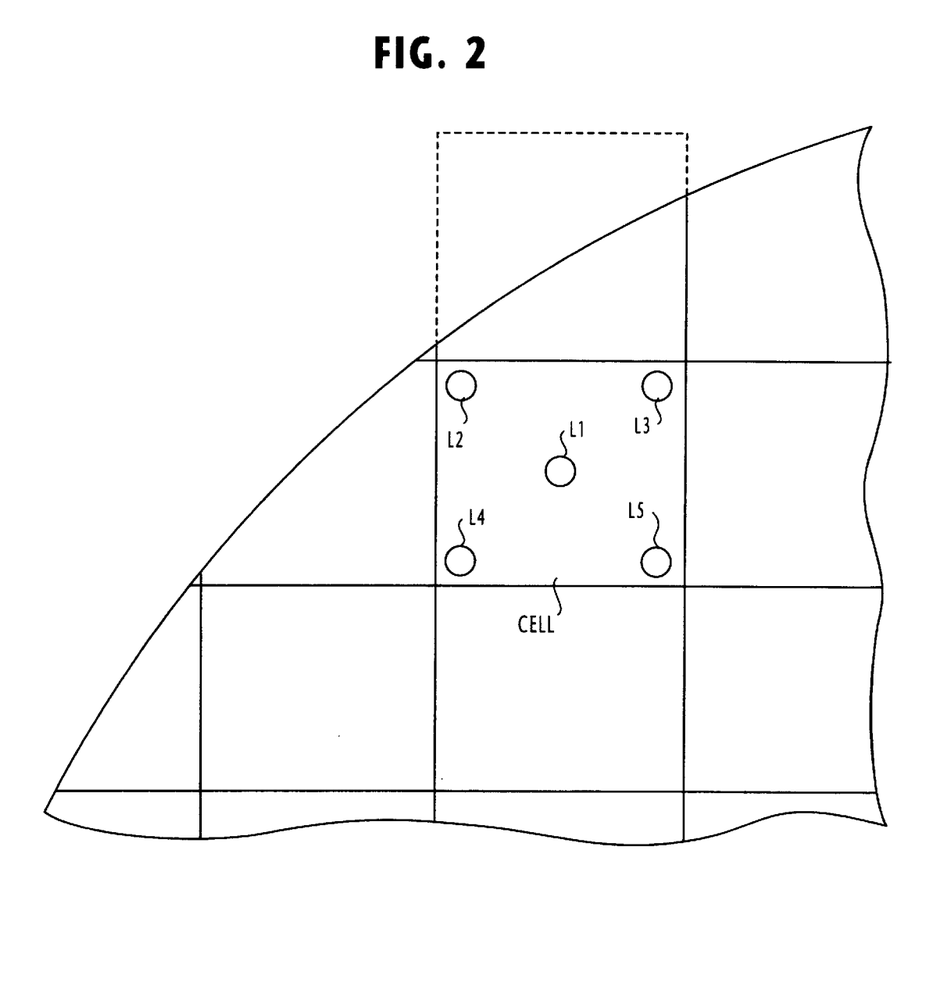
FIG. 2 is a plan view of a portion of a semiconductor wafer showing the spots of each cell illuminated by respective laser beams.

A laser source 130 is provided to project a set of five laser beams at an angle to the surface of the wafer 109. As clearly shown in FIG. 2, the five laser beams are directed respectively to five spots on a cell, one at the center (L1) of the cell and the others at corner points (L2 to L5) of the cell.

A photodetector 131 is mounted on a position opposite to the laser source 130 to detect light beams reflecting off the wafer surface and supplies signals indicating the angles and intensities of the reflecting beams to a Z-position analyzer 132, where the signals are analyzed and the vertical offset positions of the individual spots L1 to L5 of a cell are determined with respect to the reference Z-axis position.

The outputs of the Z-position analyzer 132 are received by a sequence controller 140. A Z-position memory 141 is connected to the sequence controller 140 to store offset position data of the individual cells of the wafer in a manner as will be described. Tilt angle calculation circuitry 142 is provided for calculating a tilt angle θ of each cell by using all offset position data supplied from the memory 141. The tilt angle determined for each cell is stored in an angle memory 143.

Sequence controller 140 is programmed to sequentially control the various elements of the apparatus including light source 100 and laser source 130, and driver circuitry 150, 151 and 152, which serve as interfaces between the controller and the actuators 120 to 124.

Figure 4A:
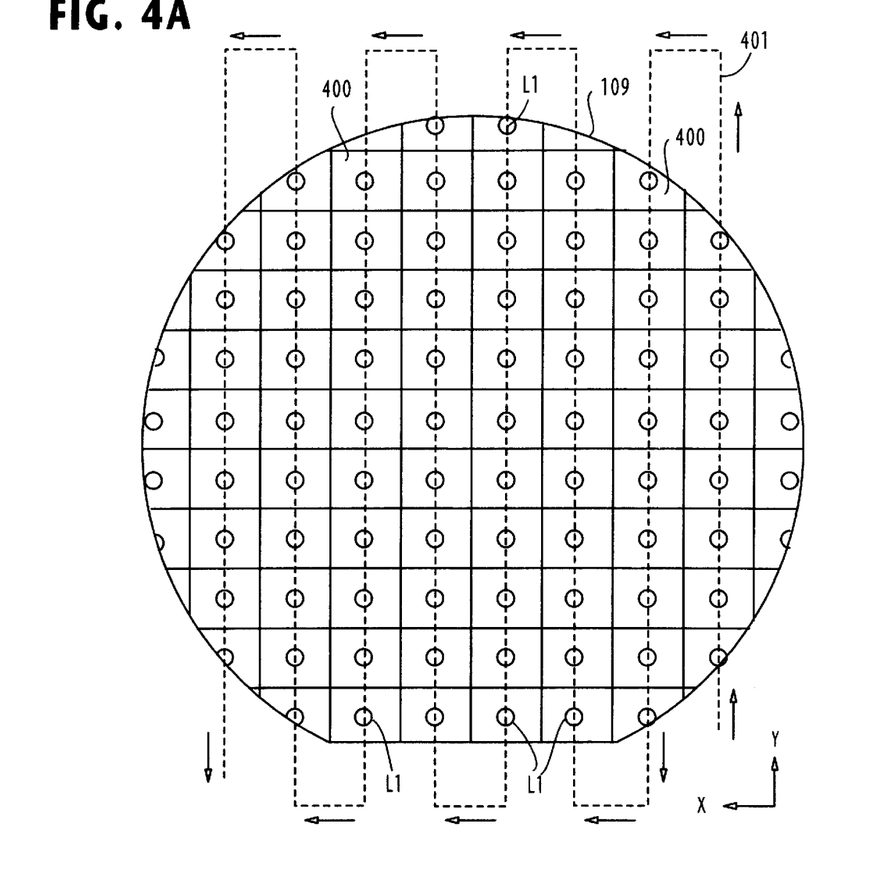
FIG. 4A is a plan view of the wafer illustrating the direction of movement of the wafer when cells are defined on the wafer surface.

Wafer 109 is partitioned into a matrix of rows and columns to define rectangular cells 400 as shown in FIG. 4A and the location of the individual cell is represented by a pair of X-and Y-axis positions. This is achieved by operating the actuator 124 via driver 152. The wafer is first set in a predetermined X-Y position so that one of the cells is brought to the focal point of the projection lens system 108. The wafer is then moved to the next column and the process is repeated, so that all cells are traversed as indicated by the arrowheads beside a meandering dotted line 401 in FIG. 4A.

According to a first embodiment of the present invention, only one of the vertical offset signals from the Z-position analyzer 132 is utilized. The operation of the sequence controller 140 of this embodiment proceeds according to the flowchart of FIG. 3.

Figure 3:
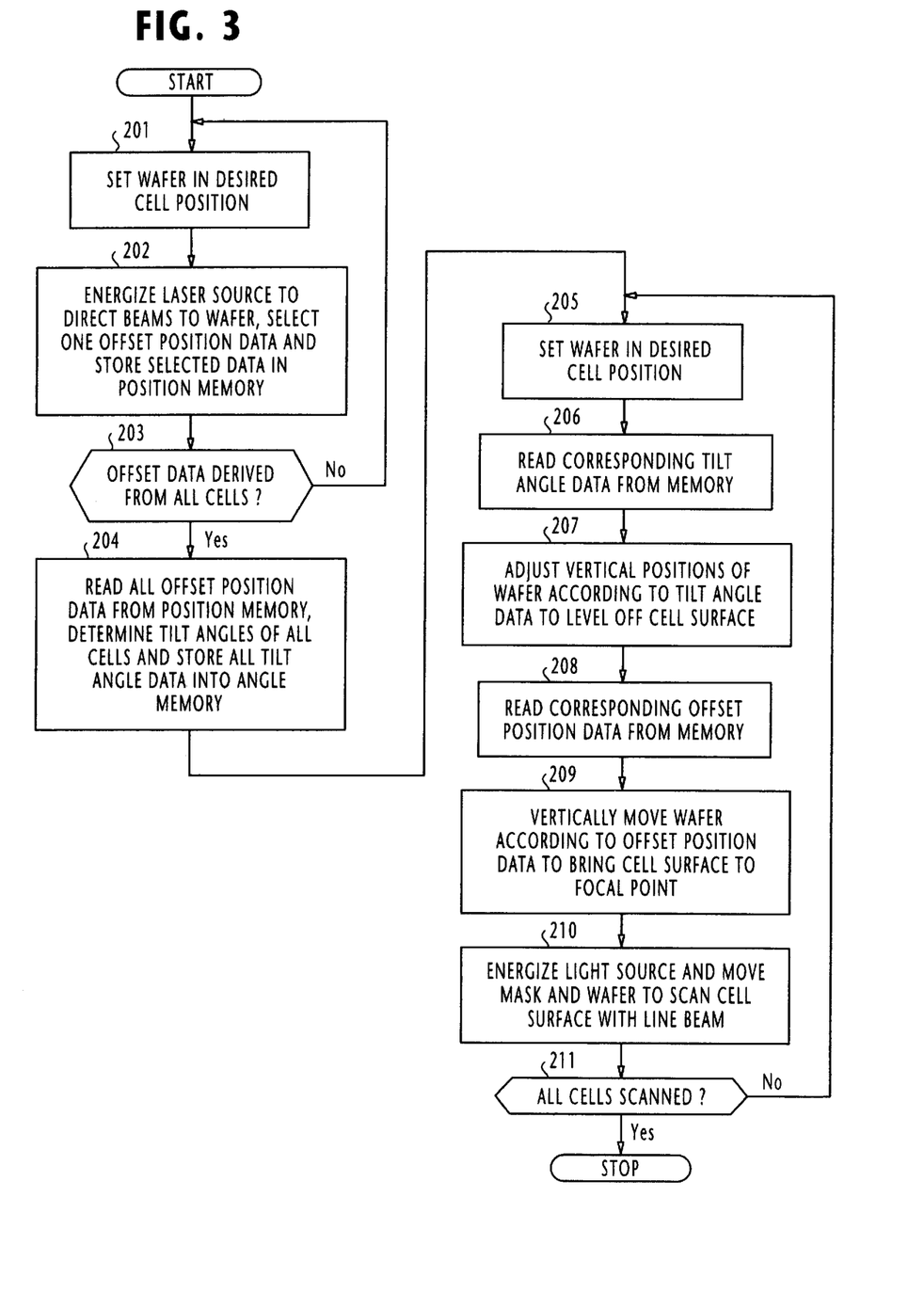
FIG. 3 is a flowchart of the operation of the sequence controller of FIG. 1 according to one embodiment of the present invention.

When a semiconductor wafer 109 is placed on the base member 110 and a mask 105 is secured to the mask support member 104, the operation of the sequence controller 140 begins with step 201 in which the sequence controller operates the actuator 124 and sets the wafer in a desired X-Y cell position where a replica of the chip pattern will be printed.

The routine proceeds to step 202 to energize the laser source 130 to emit laser beams to the wafer in the set cell position. Light reflecting off the wafer are analyzed by the Z-position analyzer 132 to produce data representing the vertical offsets of the cell at spots L1 to L5 are determined. Sequence controller 140 selects only one position data that is derived from the center spot L1 and stores the selected data into the position memory 141.

Figure 4B:
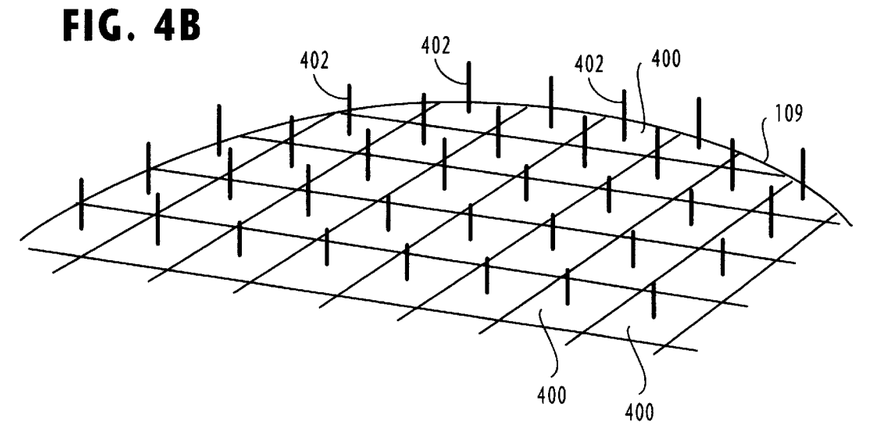
FIG. 4B is a perspective view of the wafer with vertical bars visually representing the vertical offset position of each cell.

At step 203, the sequence controller determines whether offset position data are derived from all cells and stored in the position memory 142. If not, the routine returns to step 200 to operate the actuator 124 again to set the wafer to the next cell position. In this way, a plurality of cells are defined on the surface of the wafer 109 and the individual Z-axis offset position data $Z_{(xy)}$ are derived from all cells and stored in the position memory 141. In FIG. 4b, the offset position data $Z_{(xy)}$ of all cells 400 are represented by vertical bars 402.

When the offset position data of all cells are stored in the position memory 141, the routine proceeds from step 203 to step 204 to read all offset position data from the memory 141 and instructs the tilt angle calculation circuitry 142 to determine the tilt angles of all cells of the wafer from the read position data and store data representing the individual tilt angles into the angle memory 143.

The routine then proceeds to step 205 to operate the actuator 124 to set the wafer in a predetermined X-Y position in a manner similar to step 200. At step 206, the controller reads tilt angle data from the angle memory 143 that corresponds to a cell in the current X-Y position. By using the read angle data, the sequence controller 140 operates the actuators 121, 122 and 123 that the surface of the cell is aligned to the horizontal reference plane and hence normal to the optical axis of the projection lens system 108.

Figure 5A:
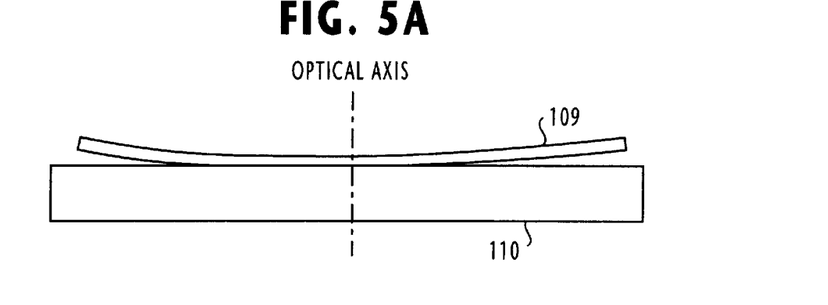
FIG. 5A is an illustration of a wafer with a warped surface.
Figure 5B:
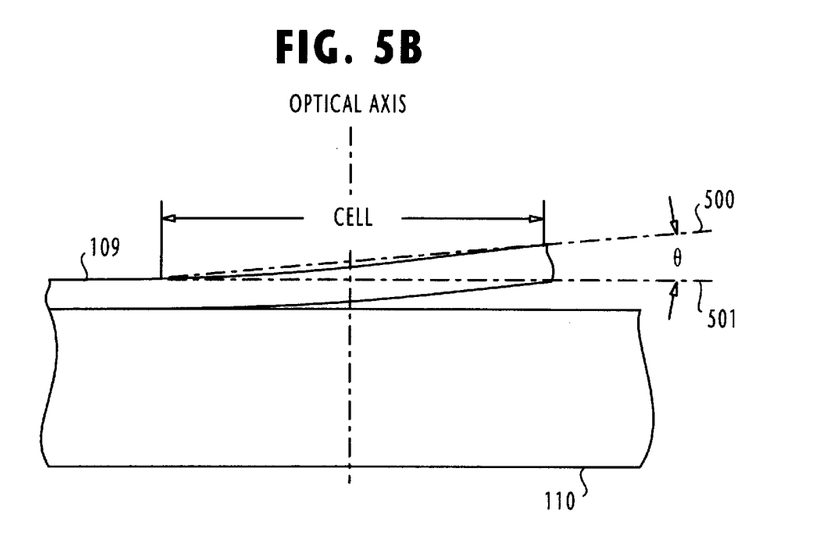
FIG. 5B is an illustration of the tilt angle of a cell surface with respect to the reference horizontal plane.
Figure 5C:
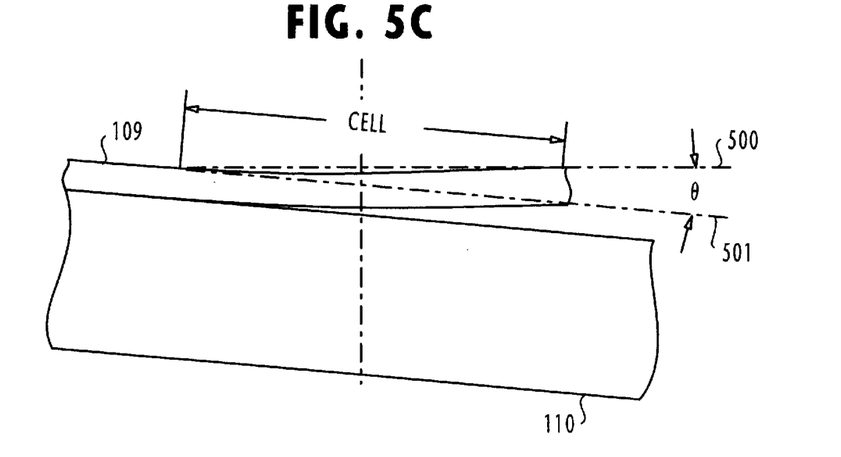
FIG. 5C is an illustration of the cell surface aligned to the reference plane after compensating for the tilt angle.

As shown in FIG. 5A on a rather exaggerated scale, the surface of the wafer 109 may be warped so that its circumference is spaced a distance from the flat surface of the wafer support member 110. If this is the case, the approximate surface 500 of the cell 400 will be tilted at an angle θ to the reference horizontal plane 501 as shown in FIG. 5B. The angle adjustment at step 207 compensates for this angle error by tilting the wafer support so that the cell surface 500 is brought into alignment with the horizontal plane as shown in FIG. 5C.

The routine then proceeds to step 208 to read the Z-axis offset position data from the position memory 141 that corresponds to the cell in the current X-Y position. By using the read offset position data, the sequence controller 140 operates the actuator 124 to move the base member 111 according to the read position data so that the surface of the cell is brought to the focal point of the projection lens system 108 (step 209).

At step 210, the sequence controller 140 energizes the light source 100 to focus an imagewise-modulated line beam onto the wafer surface and operates the actuators 120 and 124 to move the mask 105 and the wafer 109 in opposite directions along the X-axis. As a result, the focused line beam is scanned across the surface of the cell, printing the chip pattern of the mask in a reduced scale onto the cell.

Decision step 211 is then executed to check to see if steps 205 to 210 are performed on all cells of the wafer. If not, the routine returns to step 205 to repeat the process. Otherwise, the sequence controller proceeds to the end of the program.

Since the direction of scan on the wafer surface is normal to the length of the slit 107 and hence to the length of the line beam, no out-of-focus condition occurs even if the wafer is warped about an axis parallel to the length of the line beam. In other words, since the slit 107 extends in the Y-axis direction, it is sufficient that the wafer surface is parallel with the slit 107 even if it is not fully parallel with the shield member 106. Therefore, the levelling is satisfactorily achieved by tilting the base member 110 about an axis parallel to the X-axis so that the wafer surface is parallel to the slit 107.

Figure 6:
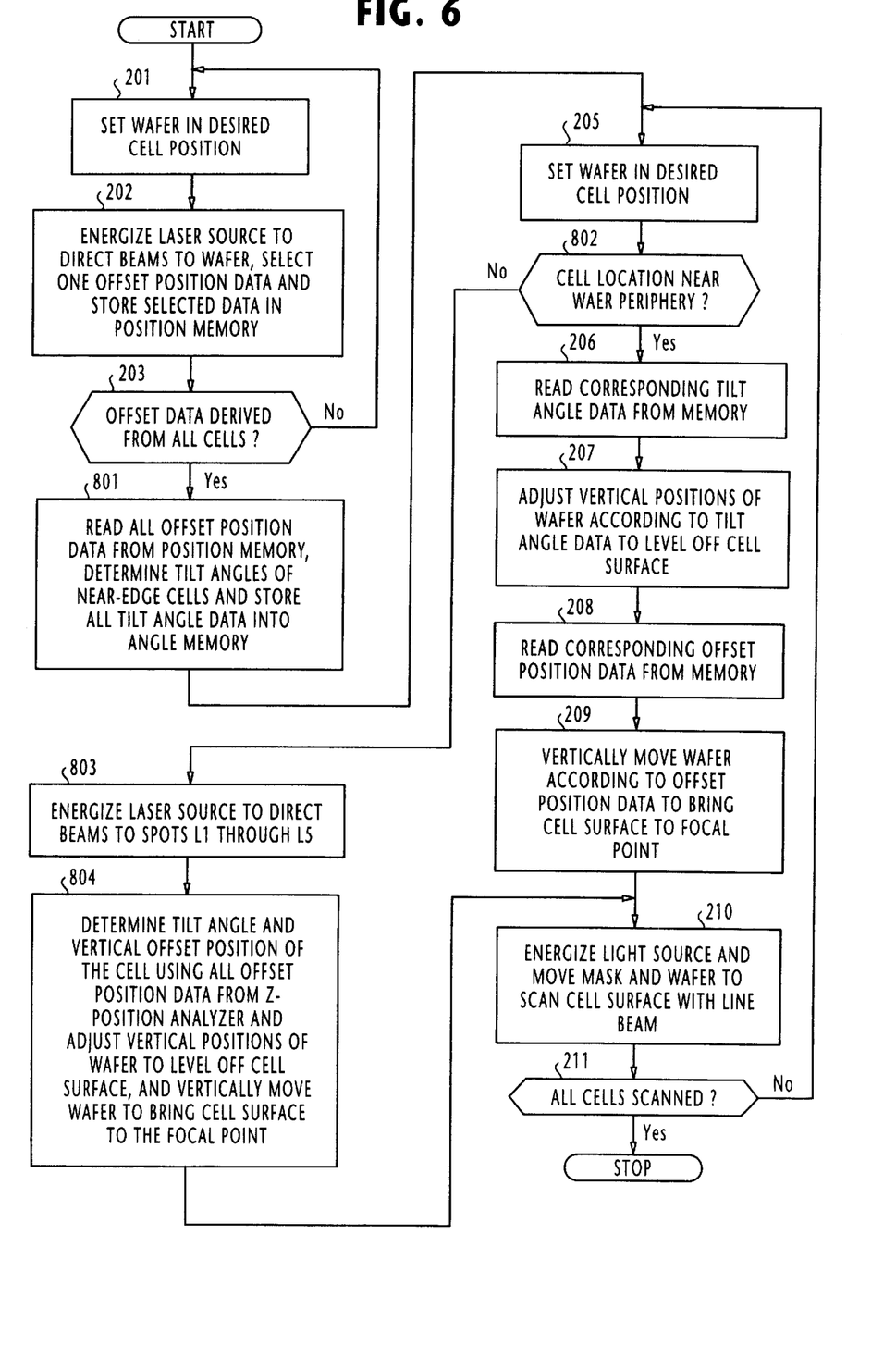
FIG. 6 is a flowchart of the operation of the sequence controller according to a modified embodiment of this invention.

A modified embodiment of the present invention is incorporated in the flowchart of FIG. 6, where the same reference numerals are used to designate steps corresponding in significance to those in FIG. 3.

In the flowchart of FIG. 6, step 204 of FIG. 3 is modified as step 801, and steps 802, 803 and 804 are additionally provided.

When the offset position data of all cells are stored in the position memory 141 (step 203), the routine proceeds to step 801 to read all offset position data from the position memory and instructs the tilt angle calculation circuitry 142 to determine the tilt angles of those cells located near the periphery of the wafer and store data representing these tilt angles into the angle memory 143.

Following the execution of step 801, the wafer is set in a desired cell position at step 205. The routine then proceeds to decision step 802 to determine if the cell location is near the periphery of the wafer.

If the location of the current cell is near the wafer periphery, the routine proceeds from step 802 to step 206 to read corresponding tilt angle data from the angle memory and the levelling is provided by using the read angle data, followed by steps 207 to 209 where the focusing is achieved by using the stored corresponding offset position data.

If the current cell is not located near the wafer periphery, the decision at step 801 is negative, and the routine proceeds to step 803 to energize the laser source 130 to direct all laser beams to spots L1 to L5 of the cell. The detected laser beams are analyzed by the position analyzer 132 to produce a plurality of vertical offset position data for the current cell. At step 804, the sequence controller 140 uses all the offset position data from the position analyzer 132 to determine the tilt angle and selects the vertical offset position of the cell at the center spot L1, and provides the levelling and focusing of the cell according to the currently determined tilt angle and to the selected vertical offset position. The routine proceeds from step 804 to step 210 for exposing the current cell to the scanned line beam.

Since the number of cells for which angle and offset position calculations are determined is significantly smaller than the previous embodiment, large capacity memories are not required to hold position and angle data. In addition, since all data derived from the spots L1 to L5 are used for the cells located inwards of the wafer periphery, precision levelling and focusing operations can be achieved for the inner cells.

What is claimed is:

1. An adjustment method for a semiconductor wafer, comprising the steps of:

a) setting the wafer in one of a plurality of cell positions;
   b) directing a laser beam to the surface of the wafer and detecting light reflecting off the surface of the wafer;
   c) analyzing the detected light and determining therefrom a vertical offset position of the wafer and storing offset position data representing said vertical offset position into a first memory;
   d) repeating steps (a) to (c) until a plurality of said offset position data are stored in said first memory, determining a plurality of tilt angles of the wafer at said plurality of cell positions from said stored plurality of offset position data, and storing a plurality of angle data representing the determined tilt angles in a second memory;
   e) setting the wafer in one of a plurality of cell positions;
   f) reading the angle data from the second memory corresponding to the set cell position and horizontally aligning the wafer surface according to the read angle data;
   g) reading the offset data from the first memory corresponding to the set cell position and vertically moving the wafer surface to said focal point according to the read offset position data; and
   h) repeating steps (e) to (g).

2. An adjustment method for a semiconductor wafer, comprising the steps of:

a) setting the wafer in one of a plurality of cell positions;
   b) directing a laser beam to the surface of the wafer at said one cell position and detecting light reflecting off the surface of the wafer;
   c) analyzing the detected light and determining therefrom a vertical offset position of the wafer at said one cell position and storing offset position data representing said vertical offset position into a first memory;
   d) repeating steps (a) to (c) until a plurality of said offset position data are stored in said first memory, determining, from said stored plurality of offset position data, a plurality of tilt angles of the wafer at a plurality of cell positions close to the periphery of said wafer, and storing a plurality of angle data representing the determined tilt angles in a second memory;
   e) setting the wafer in one of a plurality of cell positions;
   f) determining whether or not the set cell location is close to the periphery of the wafer;
   g) if the set cell location is not close to said periphery,
      $g_1$) reading the angle data from the second memory corresponding to the set cell position and horizontally aligning the wafer surface according to the read angle data; and
      $g_2$) reading the offset data from the first memory corresponding to the set cell position and vertically moving the wafer surface to said focal point according to the read offset position data;
   h) if the set cell location is close to said periphery,
      $h_1$) directing a plurality of laser beams to the surface of the set cell position of the wafer and detecting beams reflecting off said surface;
      $h_2$) analyzing the detected beams to determine a plurality of vertical offsets of said set cell position and determining therefrom a tilt angle of the wafer at said set cell position; and
      $h_3$) horizontally aligning the wafer surface according to the determined tilt angle and vertically moving the wafer surface to said focal point according to one of the vertical offsets; and
   i) repeating steps (e) to (h).

3. A method of exposing a semiconductor wafer to a chip pattern by photolithography in which an image is projected, through a mask, printed with said chip pattern, onto a surface of a wafer, comprising the steps of:

(a) setting the wafer in one of a plurality of rectangularly shaped cell positions;
   (b) sensing the position of said wafer and directing a set of five laser beams at an angle to the surface of the wafer directed respectively to five spots on a cell, one of said spots being at a center spot of the cell and the other spots being at corner spots of the cell and detecting light reflecting off the surface of the water;
   (c) analyzing the detected light and determining therefrom a vertical offset position of the wafer and storing offset position data representing said vertical offset position into a first memory;
   (d) repeating steps (a) to (c) until a plurality of said offset position data are stored in said first memory, determining a plurality of tilt angles of the wafer at said plurality of cell positions from said stored plurality of offset position data, and storing a plurality of tilt angle data representing the determined tilt angle data representing the determined tilt angles in a second memory;
   (e) setting the wafer in one of a plurality of cell positions;
   (f) reading the tilt angle data from the second memory corresponding to the set cell position and horizontally aligning the wafer surface according to the read tilt angle data;
   (g) reading the offset data from the first memory corresponding to the set cell position and vertically moving the wafer surface to said focal point according to the read offset position data;
   (h) energizing a light source to project said chip pattern image through said mask onto said wafer surface and moving said mask and said wafer in opposite directions along a horizontal axis; and
   (i) repeating steps (e) to (g) until the wafer is set to all cell positions.

4. A method according to claim 3, wherein said cells comprise rectangularly shaped cells.

5. A method of exposing a semiconductor wafer to a chip pattern by photolithography in which an image is projected, through a mask printed with said chip pattern onto a surface of a wafer, comprising the steps of:

(a) setting the wafer in one of a plurality of rectangularly shaped cell positions;
   (b) sensing the position of said wafer and directing a laser at an angle to the surface of the wafer at said one cell position and detecting light reflecting off the surface of the water;
   (c) analyzing the detected light and determining therefrom a vertical offset position of the wafer at said one cell position and storing offset position data representing said vertical offset position into a first memory;

(d) repeating steps (a) to (c) until a plurality of said offset position data are stored in said first memory, determining, from said stored plurality of offset position data, a plurality of tilt angles of the wafer at a plurality of cell positions close to the periphery of said wafer, and storing a plurality of angle data representing the determined tilt angles in a second memory;

(e) setting the wafer in one of a plurality of cell positions;

(f) determining whether or not the set cell location is close to the periphery of the wafer;

(g) if the set cell location is not close to said periphery,
   $g_1$) reading the angle data from the second memory corresponding to the set cell position and horizontally aligning the wafer surface according to the read angle data; and
   $g_2$) reading the offset data from the first memory corresponding to the set cell position and vertically moving the wafer surface to said focal point according to the read offset position data;

(h) if the set cell location is close to said periphery,
   $h_1$) directing a set of five laser beams at an angle to five spots on the surface of the set cell position of the wafer, one of the spots being at a center of the cell and the other spots being at corner spots of the cell, and detecting beams reflecting off said surface;
   $h_2$) analyzing the detected beams to determine a plurality of vertical offsets of said set cell position and determining therefrom a tilt angle of the wafer at said set cell position; and
   $h_3$) horizontally aligning the wafer surface according to the determined tilt angle and vertically moving the wafer surface to said focal point according to one of the vertical offsets;

(i) energizing a light source to project said chip pattern image through said mask onto said wafer surface and moving said mask and said wafer in opposite directions alone a horizontal axis; and (j) repeating steps (e) to (h) until the wafer is set to all cell positions.

6. A method according to claim 5, wherein said cells comprise rectangularly shaped cells.

\* \* \* \* \*

UNITED STATES PATENT AND TRADEMARK OFFICE
CERTIFICATE OF CORRECTION

PATENT NO. : 6,245,585 B1
DATED : June 12, 2001
INVENTOR(S) : Fujimoto

It is certified that error appears in the above-identified patent and that said Letters Patent is hereby corrected as shown below:

<u>Column 10,</u>
Line 18, "alone" should be -- along --

Signed and Sealed this

Eleventh Day of June, 2002

Attest:

JAMES E. ROGAN
Attesting Officer    Director of the United States Patent and Trademark Office